US012568752B2

(12) United States Patent
Yao et al.

(10) Patent No.: US 12,568,752 B2
(45) Date of Patent: Mar. 3, 2026

(54) DISPLAY PANEL AND DISPLAY DEVICE

(71) Applicant: Hubei Yangtze Industrial Innovation Center Of Advanced Display Co., Ltd., Wuhan (CN)

(72) Inventors: Qijun Yao, Shanghai (CN); Yaodong Wu, Shanghai (CN); Yang Zeng, Shanghai (CN); Linshan Guo, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 690 days.

(21) Appl. No.: 17/361,314

(22) Filed: Jun. 28, 2021

(65) Prior Publication Data

US 2021/0328199 A1 Oct. 21, 2021

(30) Foreign Application Priority Data

Feb. 5, 2021 (CN) .......................... 202110163843.3

(51) Int. Cl.
H10K 59/80 (2023.01)
H10K 59/12 (2023.01)
(Continued)

(52) U.S. Cl.
CPC ....... H10K 59/8792 (2023.02); H10K 59/122 (2023.02); H10K 59/353 (2023.02); H10K 59/12 (2023.02)

(58) Field of Classification Search
CPC .. H10K 50/865; H10K 59/122; H10K 59/353; H10K 59/8792; H10K 59/12
See application file for complete search history.

(56) References Cited

U.S. PATENT DOCUMENTS 6,950,115 B2 * 9/2005 Brown Elliott ...... G09G 3/2003
345/694
7,663,299 B2 * 2/2010 Chao .................... H10K 59/352
313/503
(Continued)

FOREIGN PATENT DOCUMENTS

CN 109216415 A 1/2019
CN 110364641 A 10/2019
(Continued)

*Primary Examiner* — Vincent Wall
(74) *Attorney, Agent, or Firm* — KILPATRICK TOWNSEND & STOCKTON LLP

(57) ABSTRACT

Provided are a display panel and a display device. The display panel includes a base substrate, an anode layer disposed on the base substrate, a pixel defining layer located on a side of the anode layer facing away from the base substrate and including first openings, a light-emitting layer located in each of the plurality of first openings, and a black matrix located on a side of the light-emitting layer facing away from the base substrate and including second openings; where the orthographic projection of each of the plurality of first openings on the base substrate overlaps the orthographic projection of each of the plurality of second openings on the base substrate, the plurality of second openings includes first-type openings, and each first-type opening of the plurality of first-type openings is polygonal and includes at least one first-type edge.

7 Claims, 15 Drawing Sheets

(51) Int. Cl.
  H10K 59/122 (2023.01)
  H10K 59/35 (2023.01)

(56)           References Cited

U.S. PATENT DOCUMENTS

| | | | | |
|---|---|---|---|---|
| 10,153,331 | B1* | 12/2018 | Jun | H10K 59/8792 |
| 10,854,684 | B2* | 12/2020 | Huangfu | H10K 59/122 |
| 11,271,048 | B2* | 3/2022 | Qiu | H10K 71/00 |
| 2008/0001525 | A1* | 1/2008 | Chao | H10K 59/353 |
| | | | | 313/503 |
| 2010/0117528 | A1* | 5/2010 | Fukuda | H10K 59/8792 |
| | | | | 313/505 |
| 2013/0234917 | A1* | 9/2013 | Lee | H10K 59/352 |
| | | | | 345/82 |
| 2015/0060906 | A1* | 3/2015 | Asaki | H10K 59/38 |
| | | | | 257/89 |
| 2015/0162394 | A1* | 6/2015 | Tokuda | H10K 59/353 |
| | | | | 257/40 |
| 2016/0124557 | A1* | 5/2016 | Choi | G06F 3/0412 |
| | | | | 345/173 |
| 2016/0276421 | A1* | 9/2016 | Lee | H10D 30/6723 |
| 2017/0179206 | A1* | 6/2017 | Lee | H10K 59/353 |
| 2017/0271420 | A1* | 9/2017 | Tsai | H10K 59/122 |
| 2018/0336818 | A1* | 11/2018 | Zheng | G09G 3/2096 |
| 2019/0013363 | A1* | 1/2019 | Joo | H10K 50/15 |
| 2019/0131371 | A1* | 5/2019 | Yi | G09G 3/3225 |
| 2019/0245017 | A1* | 8/2019 | Jeon | H10K 59/126 |
| 2021/0050388 | A1* | 2/2021 | Song | H10K 59/352 |
| 2021/0183965 | A1* | 6/2021 | Wang | H10K 59/353 |
| 2021/0328199 | A1* | 10/2021 | Yao | H10K 50/865 |
| 2022/0028957 | A1* | 1/2022 | Park | H10K 59/352 |
| 2023/0015554 | A1* | 1/2023 | Zhu | H10K 59/12 |
| 2023/0039372 | A1* | 2/2023 | Wu | H10K 59/352 |

FOREIGN PATENT DOCUMENTS

| | | | |
|---|---|---|---|
| CN | 111505896 | A | 8/2020 |
| CN | 111628104 | A | 9/2020 |
| CN | 113809258 | A | 12/2021 |

* cited by examiner

DISPLAY PANEL AND DISPLAY DEVICE

CROSS-REFERENCE TO RELATED APPLICATION(S)

This application claims priority to Chinese Patent Application No. 202110163843.3 filed Feb. 5, 2021, the disclosure of which is incorporated herein by reference in its entirety.

FIELD

Embodiments of the present disclosure relate to the field of display technology and, in particular, to a display panel and a display device.

BACKGROUND

As display techniques advances, an organic light-emitting display panel and a liquid crystal display panel have become two mainstream display panels. The organic light-emitting display panel has the advantages of low power consumption and fast response speed and thus has been widely applied to various electronic devices such as mobile phones, laptops, and computers.

The organic light-emitting display panel usually includes light-emitting units arranged in an array, and there is a lightless area between adjacent light-emitting units. When ambient light enters the display panel, the alternating arrangement of light-emitting areas and the non-light-emitting areas induces the diffraction of the reflected light, causing the user to observe bright diffraction stripes and thus affecting the visual effect.

SUMMARY

The present disclosure provides a display panel and a display device, which can induce light to diffract in more directions, and reducing the light intensity of the diffraction component in each diffraction direction, weakening the brightness of diffraction stripes, and thus improving the display effect.

Embodiments of the present disclosure provide a display panel. The display panel includes: a base substrate and an anode layer disposed on the base substrate; a pixel defining layer located on a side of the anode layer facing away from the base substrate, where the pixel defining layer includes first openings; a light-emitting layer located in each of the plurality of first openings; and a black matrix located on a side of the light-emitting layer facing away from the base substrate, where the black matrix includes second openings.

The orthographic projection of each of the plurality of first openings on the base substrate overlaps the orthographic projection of each of the plurality of second openings on the base substrate; the plurality of second openings includes first-type openings, where each first-type opening of the plurality of first-type openings is polygonal and includes at least one first-type edge, where the at least one first-type edge and the plurality of first openings include at least one of the following relationships: each of the at least one first-type edge is not parallel to any one edge of each of the plurality of first openings, or each of the at least one first-type edge is not parallel to the direction in which the plurality of first openings are arranged.

Embodiments of the present disclosure further provide a display device that includes the display panel described in other embodiments.

In the display panel provided by the embodiments of the present disclosure, the plurality of second openings includes first-type openings, where each first-type opening of the plurality of first-type openings is polygonal and includes at least one first-type edge, where the at least one first-type edge and the plurality of first openings include at least one of the following relationships: each of the at least one first-type edge is not parallel to any one edge of each of the plurality of first openings, or each of the at least one first-type edge is not parallel to the direction in which the plurality of first openings are arranged.

DETAILED DESCRIPTION

Figure 1:
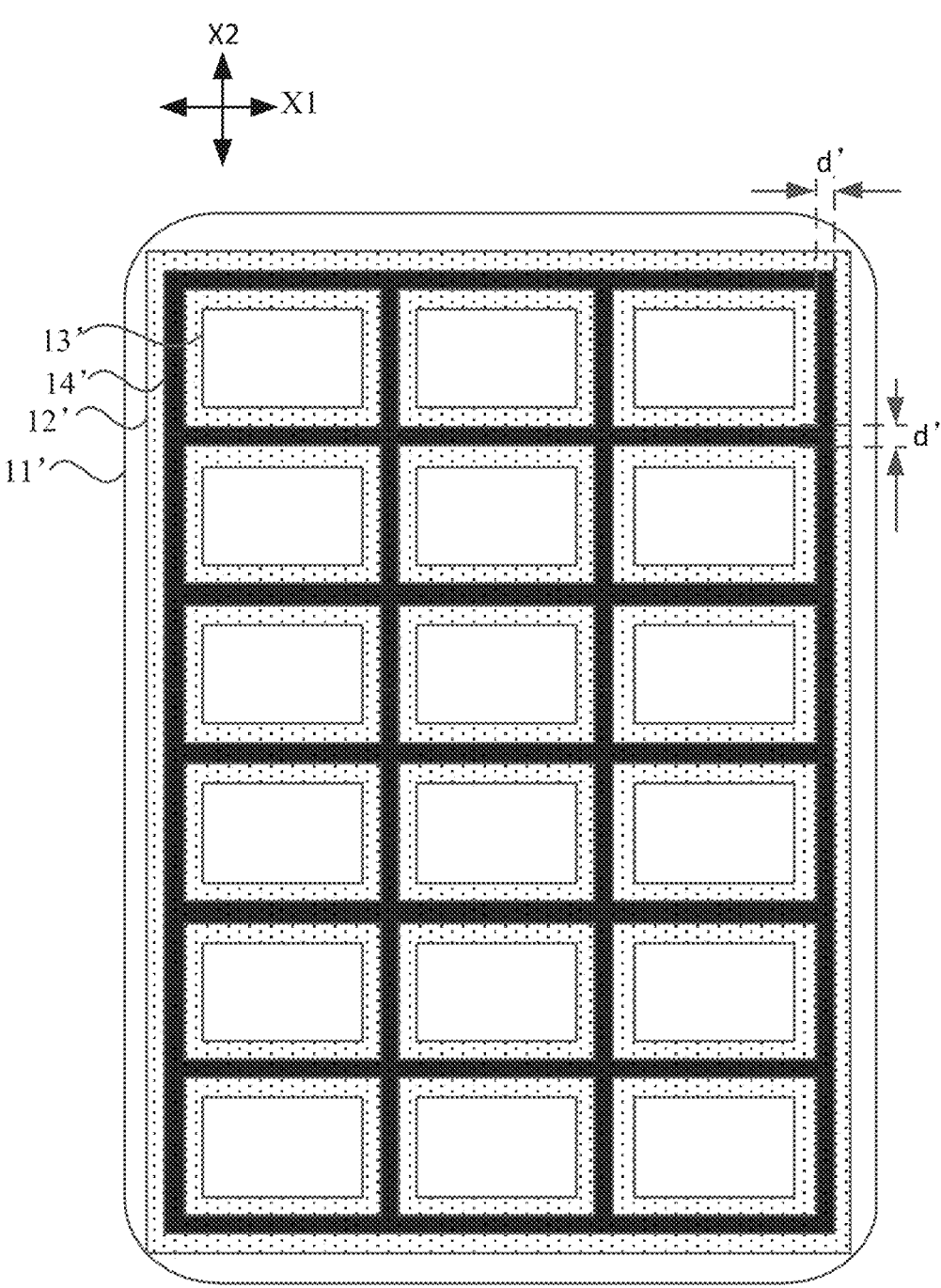
FIG. 1 is a structural view of a display panel in the related art.

The present disclosure is described in more detail hereinafter with reference to the drawings and embodiments. It is to be understood that the embodiments set forth herein are intended to explain the present disclosure and not to limit the present disclosure. Additionally, it is to be further noted that for ease of description, merely part, not all, of the structures related to the present disclosure are illustrated in the drawings.

FIG. 1 is a structural view of a display panel in the related art. With reference to FIG. 1, the display panel includes a base substrate 11', and an anode layer (not shown in FIG. 1), a pixel defining layer 12', a light-emitting layer 13', and a black matrix 14' which are sequentially stacked on the base substrate 11'. The light-emitting layer 13' is located in each opening of the 5 pixel defining layer 12', and the openings of the pixel defining layer 12' and the openings of the black matrix 14' are all rectangular in shape. However, when light enters the display panel from outside, cross-shaped stripes with a larger brightness are induced on the display panel, which seriously affects the visual effect.

It has been found that when the display panel reflects ambient light, the diffraction of light is induced, and the diffraction direction is related to the shape of the openings on the pixel defining layer and the alignment direction of the openings, and the shape of the openings on the black matrix and the alignment direction of the openings. In view of the above, the embodiments of the present disclosure provide a display panel. The display panel includes a base substrate, an anode layer disposed on the base substrate, a pixel defining layer located on a side of the anode layer facing away from the base substrate and including first openings, a light-emitting layer located in each of the plurality of first openings, and a black matrix located on a side of the light-emitting layer facing away from the base substrate and including second openings. where the orthographic projection of each of the plurality of first openings on the base substrate overlaps an orthographic projection of each of the plurality of second openings on the base substrate, and the plurality of second openings includes first-type openings, where each first-type opening of the plurality of first-type openings is polygonal and includes at least one first-type edge, where the at least one first-type edge and the plurality of first openings include at least one of the following relationships: each of the at least one first-type edge is not parallel to any one edge of each of the plurality of first openings, or each of the at least one first-type edge is not parallel to a direction in which the plurality of first openings are arranged. In the above solution, the plurality of second openings includes first-type openings, where each first-type opening of the plurality of first-type openings is polygonal and includes at least one first-type edge, where each of the at least one first-type edge is not parallel to any one edge of each of the plurality of first openings, and/or each of the at least one first-type edge is not parallel to a direction in which the plurality of first openings are arranged. With the above setting, the diffraction directions can be increased to induce more diffraction components, and thus the diffraction stripes are dispersed in more directions, and reducing the light intensity on each diffraction component, weakening the brightness of diffraction stripes, improving the problem of visual deterioration caused by the diffraction, and has the effect of weakening the brightness of diffraction stripes and improving the display effect.

The preceding is one embodiment of the present application. Embodiments of the present disclosure are described clearly and completely below in conjunction with the drawings in the embodiments of the present disclosure. Apparently, the embodiments described below are part, not all, of the embodiments of the present disclosure.

Figure 2:
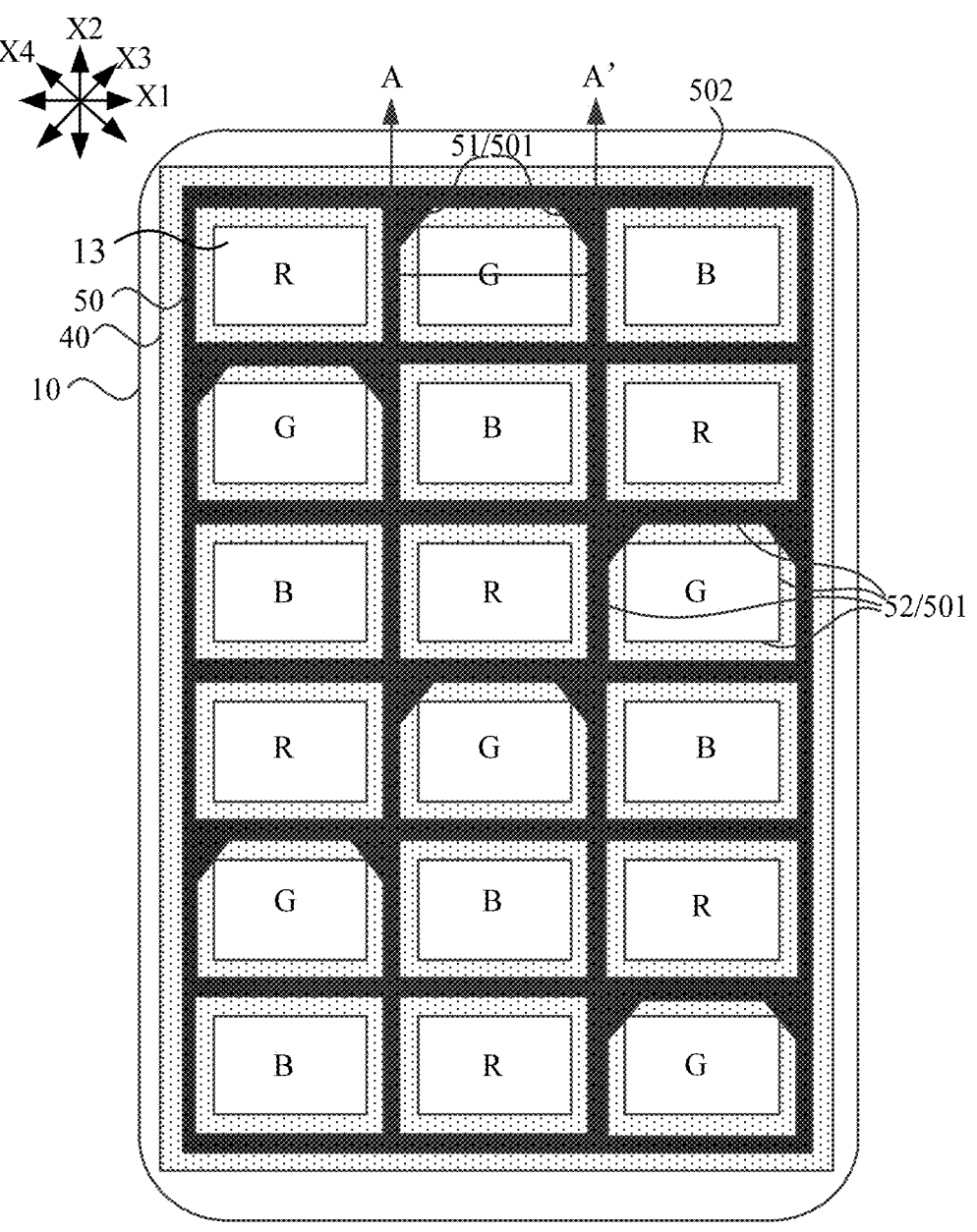
FIG. 2 is a structural view of a display panel according to an embodiment of the present disclosure.
Figure 3:
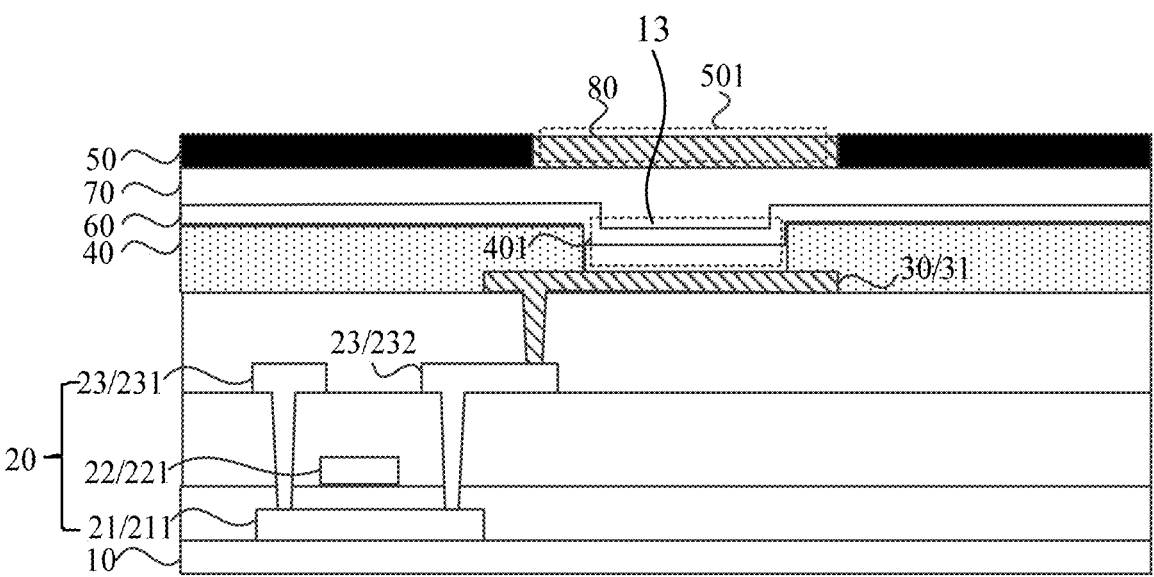
FIG. 3 is a sectional view along section line AA' of FIG. 2.
Figure 4:
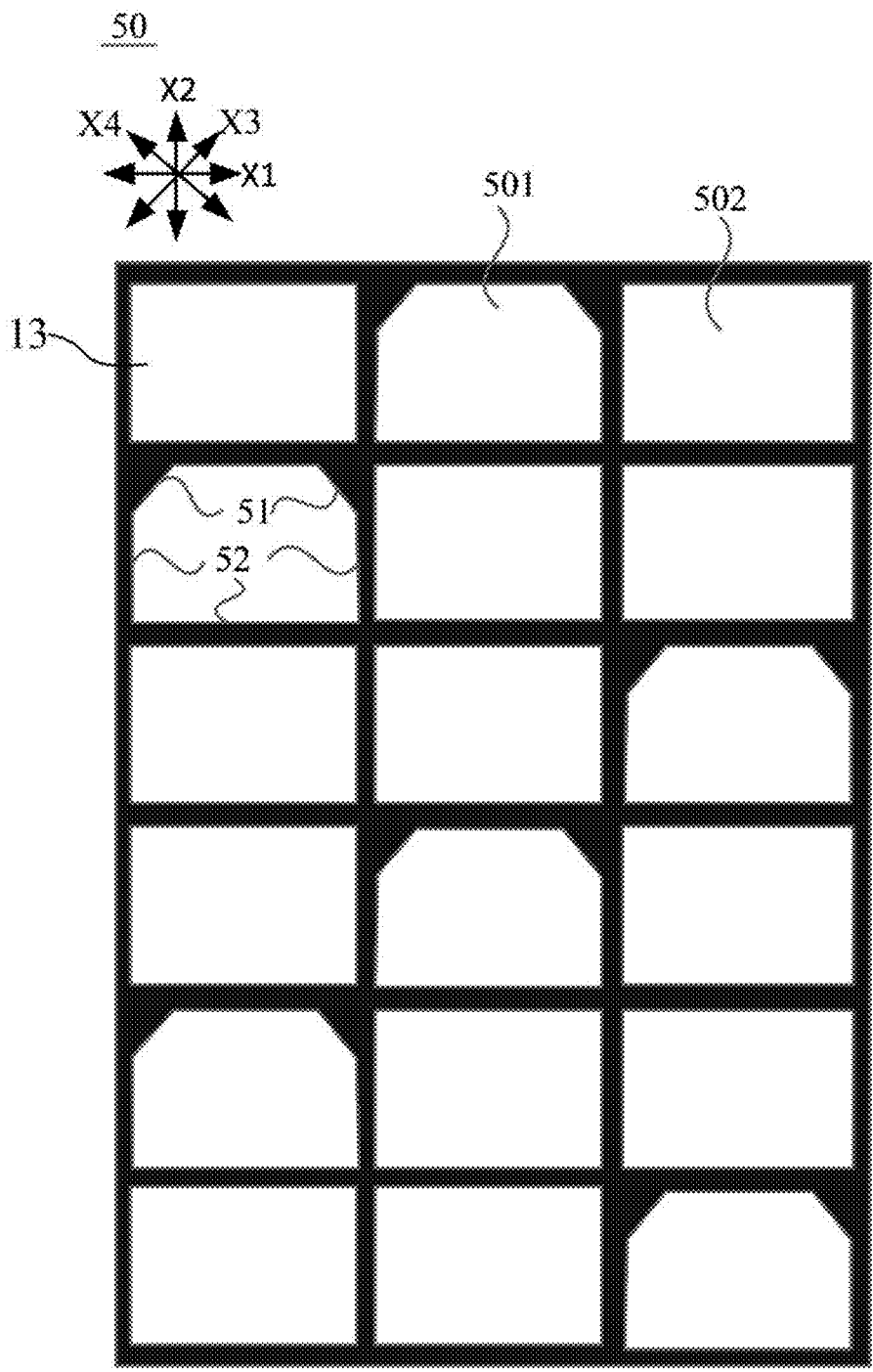
FIG. 4 is a structural view of a black matrix in FIG. 2.

FIG. 2 is a structural view of a display panel according to an embodiment of the present disclosure. FIG. 3 is a sectional view along section line AA' of FIG. 2. FIG. 4 is a structural view of a black matrix in FIG. 2. With reference to FIGS. 2 TO 4, The display panel includes: a base substrate 10, an anode layer 30 disposed on the base substrate 10, a pixel defining layer 40 located on a side of the anode layer 30 facing away from the base substrate 10 and including first openings 401, a light-emitting layer 13 located in each of the plurality of first openings 401, and a black matrix 50 located on a side of the light-emitting layer 13 facing away from the base substrate 10 and including second openings; where the orthographic projection of each of the plurality of first openings 401 on the base substrate 10 overlaps the orthographic projection of each of the plurality of second openings on the base substrate 10, and the plurality of second openings includes first-type openings 501, where the first-type opening 501 is polygonal and includes at least one first-type edge 51, where the at least one first-type edge and the plurality of first openings include at least one of the following relationships: each of the at least one first-type edge 51 is not parallel to any one edge of each of the plurality of first openings 401, or each of the at least one first-type edge 51 is not parallel to a direction in which the plurality of first openings 401 are arranged.

In one embodiment, the base substrate 10 is used for supporting and protecting film layers formed thereon. The base substrate 10 may be a rigid substrate, for example, the material of the base substrate 10 is glass. The base substrate 10 may also be a flexible substrate, for example, the material of the base substrate 10 may include one or a combination of more than one of polyether sulfone, polyacrylate, polyetherimide, polyethylene glycol naphthalate, polyethylene glycol terephthalate, polyphenylene sulfide, polyarylate, polyimide, polycarbonate, or polymer resin of cellulose-acetate propionate. The material of the base substrate 10 is not limited herein.

In an embodiment, the display panel further includes an array layer 20 disposed on the base substrate 20, and the array layer 20 includes a pixel circuit.

The display panel further includes a display function layer on a side of the array layer facing away from the base substrate 10. The display function layer includes an anode 31, the pixel defining layer 40, an organic light-emitting material which is not shown in FIGS. 2-4 (that is, the light-emitting layer), and a cathode 60 which are stacked sequentially.

In one embodiment, the anode layer 30 includes anodes 31 whose material may include indium tin oxide (ITO), indium zinc oxide (IZO), tin oxide (SnO2), zinc oxide (ZnO), aluminum (Al), silver (Ag), or magnesium (Mg). The material of the anode layer 30 is not limited herein.

In one embodiment, the pixel defining layer 40 defines light-emitting areas through the first openings 401. The material of the pixel defining layer 40 may include polyimide, polyethylene glycol terephthalate, polycarbonate, polyethylene, or polyacrylate. The material of the pixel defining layer 40 is not limited herein. It is to be noted that FIG. 2 only illustrates that the plurality of first openings 401 are rectangular in shape and arranged in rows and columns, but the present disclosure is not limited thereto. In one embodiment, the shape and arrangement of the plurality of first openings 401 according to the actual situation. In an embodiment, the shape of each of the plurality of first openings 401 may also be an "L"-like shape, diamond-like shape, etc., and the plurality of first openings 401 may also be arranged in a triangle shape. It is to be further noted that the arrangement of the plurality of first openings 401 determines the number of the arrangement directions of the plurality of first openings 401 and the specific arrangement directions, and the arrangement direction of the plurality of first openings 401 refer to the direction in which the plurality of first openings 401 regarded as particles are periodically arranged. The plurality of first openings 401 are arranged in an array in the column direction (second direction X2) and the row direction (first direction X1) and thus form a first opening array. The row direction and the column direction are parallel to the plane where the display panel is located.

In one embodiment, the light-emitting layer 13 includes light-emitting blocks (organic light-emitting material), and each of the plurality of light-emitting blocks is located in the respective one of the plurality of first openings 401. The display panel may further include a cathode 60 located on a side of the light-emitting layer 13 facing away from the base substrate 10, and the anode 31, the light-emitting blocks, and the cathode 60 are stacked to form light-emitting units. The light-emitting color of the light-emitting units is related to the material of the light-emitting blocks, and the light-emitting layer 13 may include red light-emitting blocks R, green light-emitting blocks G, blue light-emitting blocks, yellow light-emitting blocks, white light-emitting blocks, and the like. The material of the light-emitting layer 13 is not limited herein.

In one embodiment, the black matrix 50 includes second openings so that the light emitted by the light-emitting units can exit through the plurality of second openings, and the arrangement of the plurality of second openings is the same as the arrangement of the plurality of first openings 401. The material of the black matrix 50 may a black insulating material. The material of the pixel defining layer 40 is not limited herein. There are various specific manners to implement the overlapping between the orthographic projection of each of the plurality of first openings 401 on the base substrate 10 and the orthographic projection of each of the plurality of second openings on the base substrate 10, which is not limited herein. In one embodiment, the orthographic projection of each of the plurality of first openings 401 on the base substrate 10 may be within the orthographic projection of each of the plurality of second openings on the base substrate 10 so that the display panel can be brighter at a large viewing angle, ensuring that the display panel has a wide viewing angle range so that the observer can also observe a clear to-be-displayed image from the side direction.

It is to be noted that the anode layer 30 usually has reflectivity. When ambient light enters the display panel, the light reflected by the anode layer 30 passes through the pixel defining layer 40 and the black matrix 50 and then diffract. The specific shape of the diffraction stripe is related to the shape and arrangement direction of the plurality of first openings 401 in the pixel defining layer 40 and the shape and arrangement direction of the plurality of second openings of the black matrix 50. In one embodiment, among the plurality of diffraction directions induced by the pixel defining layer 40, some of the diffraction directions are perpendicular to the extension direction of the edge of the first opening 401, and some diffraction directions are perpendicular to the arrangement direction of the first openings 401. The situation of diffraction directions induced by the black matrix 50 is similar to the situation of diffraction directions induced by the pixel defining layer 40, which is not repeated herein. In the related art, the first openings and the second openings usually are set to have the same shape and arrangement direction, for example, as shown in FIG. 1, so that the diffraction directions induced by the pixel defining layer 40 are the same as the diffraction directions induced by the black matrix 50. However, in the embodiments of the present disclosure, at least a part number of the second openings are first-type openings 501, each of the first-type openings 501 includes at least one first-type edge 51, and each of the at least one first-type edge 51 is not parallel to any one edge of each of the plurality of first openings 401 and/or each of the at least one first-type edge 51 is not parallel to the direction in which the plurality of first openings 401. With the above setting, the diffraction directions induced by the at least one first-type edge 51 on the black matrix 50 are different from any diffraction direction induced by the plurality of first openings 401 on the pixel defining layer 40. In this way, compared to the case where the pixel defining layer 40 and the black matrix 50 induce diffraction stripes having the same diffraction direction, when the diffraction directions of light induced by the pixel defining layer 40 and the black matrix 50 are not completely the same, diffraction directions of the induced diffraction stripes are increased, and the light intensity in each diffraction direction is weakened (compared to the display panel shown in FIG. 1), and weakening the brightness of the diffraction stripes and improving the problem in which diffraction stripes affect the display effect.

In an embodiment, with reference to FIG. 1, in the display panel in the related art, each of the first openings and the second openings includes an edge extending in the first direction X1 and an edge extending in the second direction X2, and the first openings and the second openings are arranged in the first direction X1 and the second direction X2, so that diffraction stripes induced by the display panel are in the shape of "+". However, in the display panel shown in FIG. 2, the arrangement direction of the plurality of second openings is the same as the arrangement direction of the plurality of first openings 401, the part number of the second openings each has the same shape as the first opening 401, and the part number of the second openings (which are also the first-type openings 501) each includes an edge extending in the first direction X1, an edge extending in the second direction X2, an edge extending in the third direction X3, and an edge extending in the fourth direction X4, so that the diffraction stripes induced by the display panel are in the shape of "*". As can be seen, compared to the display panel shown in FIG. 1, the display panel shown in FIG. 2 can have two more induction directions. In other words, the diffraction light originally dispersed in the two diffraction directions is redistributed to the four diffraction directions so that the light intensity in each diffraction direction is reduced, and has the effect of weakening the brightness of the diffraction stripes.

It is to be noted that FIGS. 2 and 4 illustrate that the shape of each of the first-type openings 501 is the same, but the present disclosure is not limited thereto. For example, in other embodiments, there may further be at least two first-type openings 501 whose shape is different from each other.

It is to be further noted that the anode, cathode, encapsulation layer, and color resistance are not shown in FIG. 2 to clearly demonstrate the plurality of first openings 41 on the pixel defining layer 40, but the anode, cathode, encapsulation layer, and color resistance are shown in FIG. 3 to clearly present the specific film layer relationship of the display panel. In an embodiment, as shown in FIG. 3, the display panel further includes an array layer 20 between the base substrate 10 and the anode layer 30. The array layer 20 includes a driver circuit, and the driver circuit includes thin-film transistors. In each of the plurality of thin-film transistors, the active layer 211 is disposed in a semiconductor layer 21, the gate 221 is disposed in a gate metal layer 22, and the source 232 and the drain 231 are disposed in a second metal layer 23. The display panel further includes a cathode 60 located on a side of the light-emitting layer 13 facing away from the base substrate 10, an encapsulation layer 70 located on a side of the black matrix 50 facing towards the base substrate 10, and a color resistance 80 located in the second opening, but the present disclosure is not limited thereto. In some embodiments, set film layers included in the display panel and the relative positional relationship between the film layers according to the actual situation.

In the display panel provided by the embodiments of the present disclosure, the plurality of second openings includes first-type openings 501, where the first-type opening 501 is polygonal and includes at least one first-type edge 51, where the at least one first-type edge 51 and the plurality of first openings 401 include at least one of the following relationships: each of the at least one first-type edge 51 is not parallel to any one edge of each of the plurality of first openings 401, or each of the at least one first-type edge 51 is not parallel to the direction in which the plurality of first openings 401 are arranged. With the above setting, the diffraction directions can be increased to induce more diffraction components, and thus the diffraction stripes are dispersed in more directions, and reducing the light intensity on each diffraction component, weakening the brightness of diffraction stripes, improving the problem of visual deterioration caused by the diffraction, and has the effect of weakening the brightness of diffraction stripes and improving the display effect.

In one embodiment, for the plurality of second openings on the black matrix 50, there are various specific implementations for specifically which second openings being the first-type openings 501. The above specific implementations will be described below by means of typical examples, but these examples are not intended to limit the present application.

With continued reference to FIG. 2, in an embodiment, the light-emitting layer 13 includes red light-emitting blocks R, green light-emitting blocks G, and blue light-emitting blocks B, and a second opening corresponding to each of the green light-emitting blocks G is one of the first-type openings 501.

It is to be understood that if each of the second openings corresponding to the red, green, and blue light-emitting blocks is of the same shape as each of the plurality of first openings 401, since the human eye is most sensitive to green, the brightness of the green component in the diffraction stripes is the strongest and thus the green component is the most obvious. When the second opening corresponding to each of the green light-emitting blocks G is set to be one of the first-type openings 501, the brightness of the green component in the diffraction stripes can be weakened, and greatly attenuating the overall brightness of the diffraction stripes.

With continued reference to FIG. 2, in an embodiment, the plurality of second openings further includes second-type openings 502, and the shape of one of the plurality of second-type openings is the same as the shape of one of the plurality of first openings 401 corresponding to the one of the plurality of second openings; and the light-emitting layer 13 includes red light-emitting blocks R, green light-emitting blocks G, and blue light-emitting blocks B, and a second opening corresponding to each of the blue light-emitting blocks B is one of the second-type openings 502.

It is to be understood that due to the limitations in the fabrication process of the black matrix 50, generally, the line width of the black matrix 50 is near the process limit line width. In an embodiment, in the display panel shown in FIG. 1, the shape of each second opening is set to be the same as the shape of each first opening 401, and the size of each second opening is such that the line width d' of the black matrix 50 is near the process limit line width. With the above setting, the size of the second opening can be set to be large enough, which in turn makes the display panel sufficiently bright at the large viewing angle. The plane where the black matrix 50 is located includes second opening setting areas. The shape of each of the plurality of second opening setting areas is the same as the shape of each of the plurality of first openings 401, the center of each of the plurality of second opening setting areas coincides with the center of the orthographic projection of the respective one of the plurality of first openings 401 on the plane where the black matrix 50 is located, and the minimum spacing between adjacent edges of adjacent second opening setting areas is equal to a preset value (for example, the preset value is the process limit line width of the black matrix 50). For the display panel shown in FIG. 2, each of the second-type openings coincides with the respective one of the plurality of second opening setting areas. If the shape of a second opening adjacent to a first-type opening 501 is the same as the shape of each of the plurality of first openings 401, the size of this first-type opening 501 may be smaller than the size of the second opening setting area (for example, as shown in the display panel in FIG. 2) due to the fabrication process of the black matrix 50 so that the brightness of the sub-pixels corresponding to this first-type opening 501 at the large viewing angle can be weakened and the problem of the color cast at the large viewing angle can be improved based on this characteristic. The specific principle is explained as follows: if in a case where the red, green, and blue sub-pixels are of the same design (for example, as shown in FIG. 1), the display panel is yellow-shifted at the large viewing angle, the second openings corresponding to the blue light-emitting blocks B are set to be the second-type openings 502 and the second openings corresponding to at least part of both the green light-emitting blocks G and red light-emitting blocks R are set to be the first-type openings 501, so that the brightness of blue sub-pixels at the large viewing angle is ensured to be large sufficiently and the brightness of the red and/or green sub-pixels at the large viewing angle is weakened to some extent, and has the effect of weakening the brightness of the diffraction stripes while improving the problem that the display panel is yellow-shifted at the large viewing angle, and making the color cast at the large viewing angle closer to the white balance.

It is to be further understood that if in a case where the red, green, and blue sub-pixels are of the same design, the display panel is still more shifted to one of these colors at the large viewing angle, the second openings of pixels corresponding to the color having higher brightness at the large viewing angle are set to be the first-type openings whose size is smaller than the size of the second opening setting area, and the second openings in pixels corresponding to colors having lower brightness at the large viewing angle are set to be the second-type opening, and details are not described herein. The higher brightness at the large viewing angle and the lower brightness at the large viewing angle described herein are both based on the premise that the red, green, and blue sub-pixels are of the same design.

Figure 5:
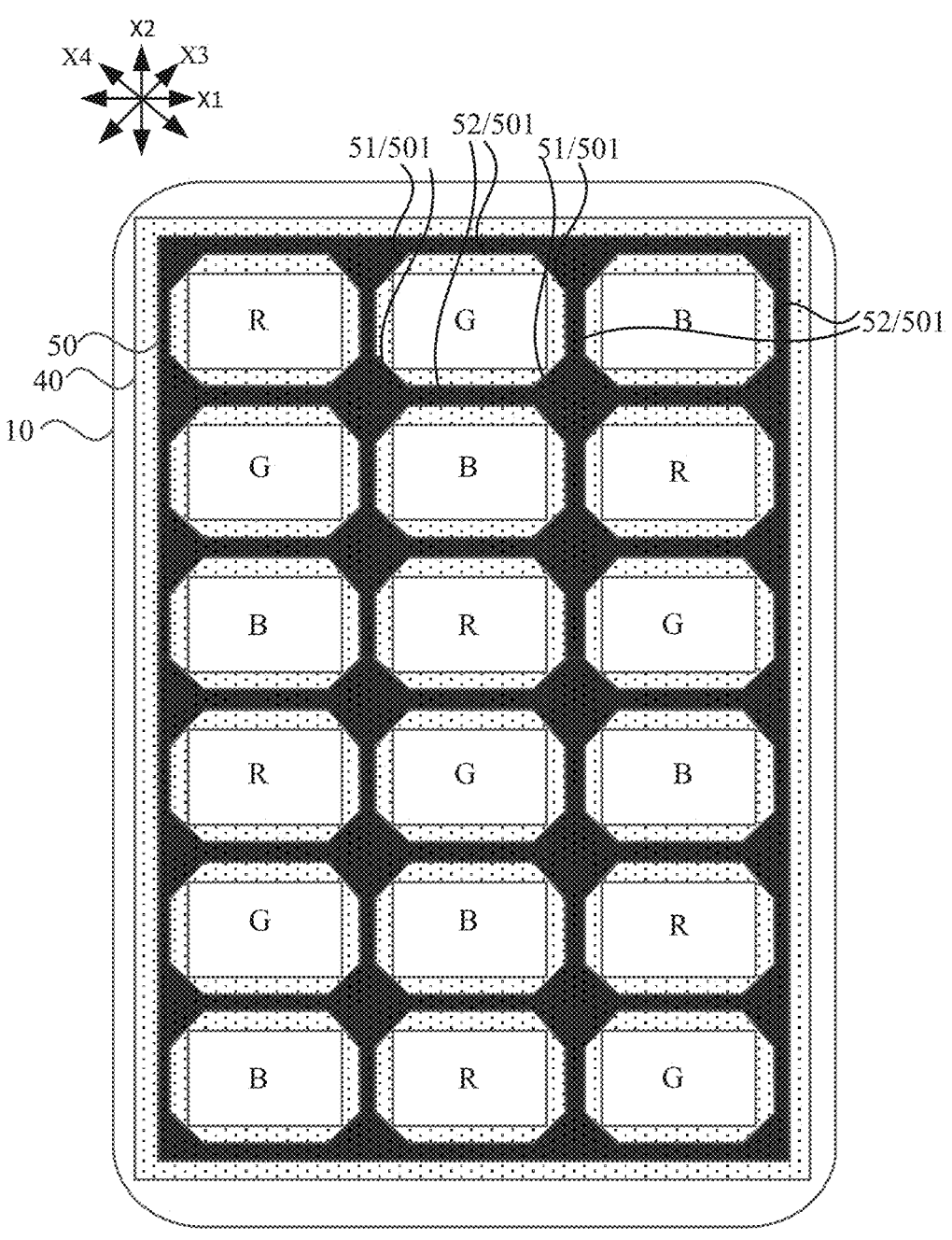
FIG. 5 is a structural view of another display panel according to an embodiment of the present disclosure.

FIG. 5 is a structural view of another display panel according to an embodiment of the present disclosure. With reference to FIG. 5, in an embodiment, each of the plurality of second openings is the first-type opening 501.

It is to be understood that each of the plurality of second openings is the first-type opening 501 so that the density of the first-type edges 51 on the display panel can be increased and thus the brightness in the diffraction direction induced by the first-type edge 51 becomes large. In other words, with the above setting, the brightness in other diffraction directions can be greatly weakened so that the brightness difference in each diffraction direction in the diffraction stripes is reduced and the brightness in each diffraction direction becomes smaller. In this way, the overall brightness of the diffraction stripes finally presented can be weakened.

In one embodiment, there are various specific implementations of the first-type opening 501. The above specific implementations will be described below by means of typical examples, but these examples are not intended to limit the present application.

With continued reference to FIGS. 2 and 5, in an embodiment, each of the at least one first-type edge 51 is a linear segment.

In one embodiment, the number and the extension direction of the at least one first-type edge 51 in each of the first-type openings 501 can be set according to the actual situation, which is not limited herein. When each of the at least one first-type edge 51 is a linear segment, the extension direction of each of the at least one first-type edge 51 in the same first-type opening 501 may be the same or different, which may be set according to the actual situation and is not limited herein. In one embodiment, the extension direction of each of the at least one first-type edge 51 in the same first-type opening 501 is different. In this way, the diffraction direction induced by each of the at least one first-type edge 51 is different, and the diffraction stripes can be dispersed to more diffraction directions. Therefore, the more diffraction directions included in the diffraction stripes finally presented, the smaller the brightness in each diffraction direction is, and the more favorable it is to improve the problem of visibility degradation caused by diffraction stripes.

It is to be understood that since the fabrication process difficulty of the linear segment is low, when each of the at least one first-type edge 51 is the linear segment the fabrication process difficulty of the first-type opening 501 can become lower, and reducing the cost.

Figure 6:
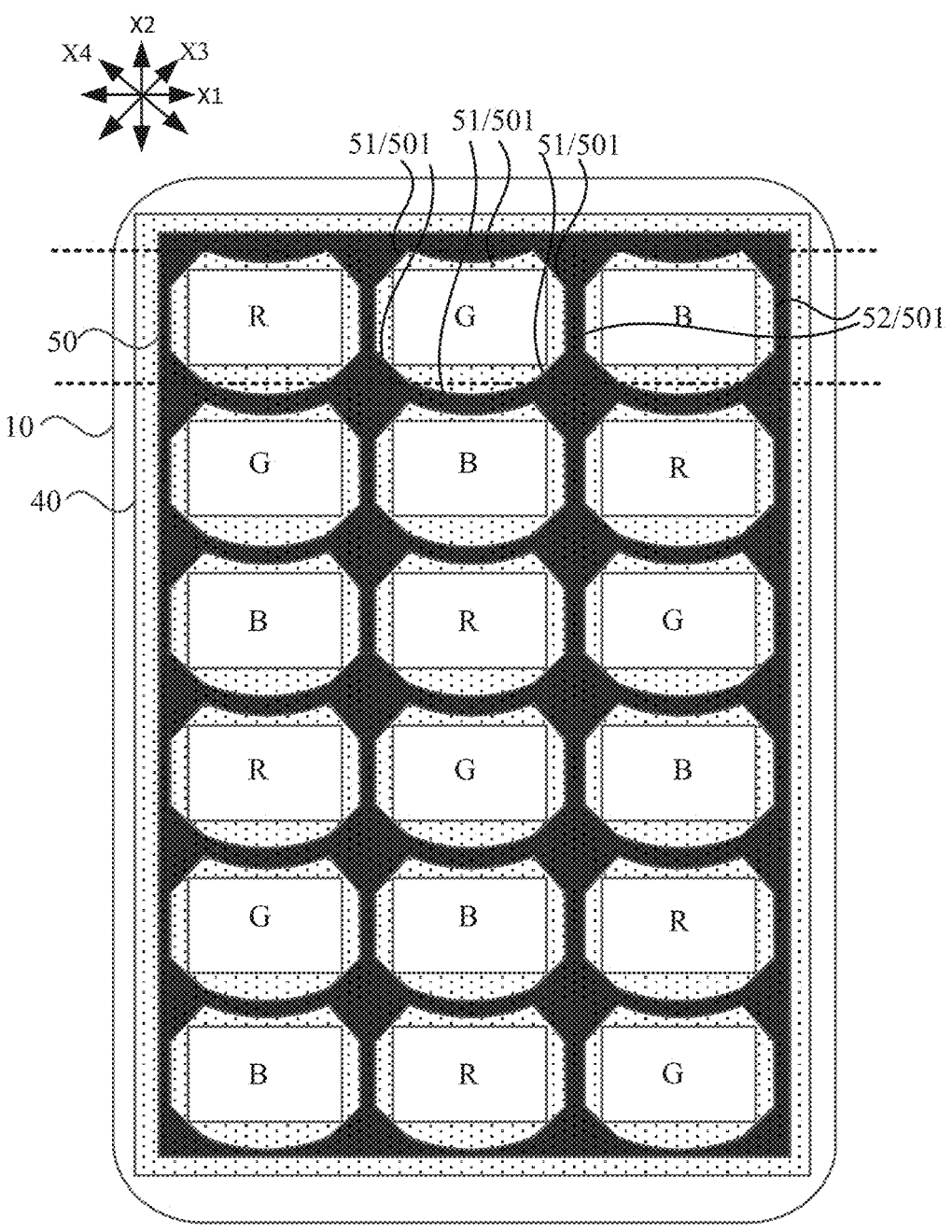
FIG. 6 is a structural view of another display panel according to an embodiment of the present disclosure.

FIG. 6 is a structural view of another display panel according to an embodiment of the present disclosure. With reference to FIG. 6, in an embodiment, in the plurality of first-type edges 51 in each of the first-type openings 501, at least one first-type edge 51 is an arc segment.

In one embodiment, the arc segment described herein refers to curved segments such as normal arc segments and elliptical arc segments. The number and the curving direction of each of the first-type edge 51 in each of the first-type openings 501 can be set according to the actual situation, which is not limited herein.

It is to be understood that the diffraction direction induced by any one point on the arc segment is perpendicular to the tangent to this point. When at least one first-type edge 51 is set as an arc segment, the diffraction stripes can be dispersed to more diffraction directions so that the brightness in each diffraction direction becomes smaller. In this way, the overall brightness of the diffraction stripes finally presented can be weakened.

With continued reference to FIG. 2, 5, or 6, in an embodiment, each of the first-type openings 501 further includes at least one second-type edge 52, and one of the at least one second-type edge 52 in one of the first-type openings 501 is parallel to an edge of one of the first openings 401, where the one of the first-type openings 501 corresponds to the one of the first openings 401, and the one of the at least one second-type edge 52 neighbors the edge of one of the first openings 401.

In one embodiment, each of the at least one second-type edge 52 is located on the boundary line of the second opening setting area. In other words, the first-type opening 501 including both the first-type edge 51 and the second-type edge 52 is equivalently obtained by changing the part of the boundary line of the second opening setting area to the first-type edge 51. As described above, when the first-type edge 51 is set such that the size of the first-type opening 501 is smaller than the size of the second opening setting area, the brightness of the sub-pixels corresponding to the first-type opening 501 is weakened at the large viewing angle. When each of the first-type openings 501 further includes—second type edge 52, the brightness of the sub-pixels corresponding to the first-type opening 501 can become smaller at the large viewing angle, and ensuring that the brightness at the large viewing angle is sufficiently large.

Figure 7:
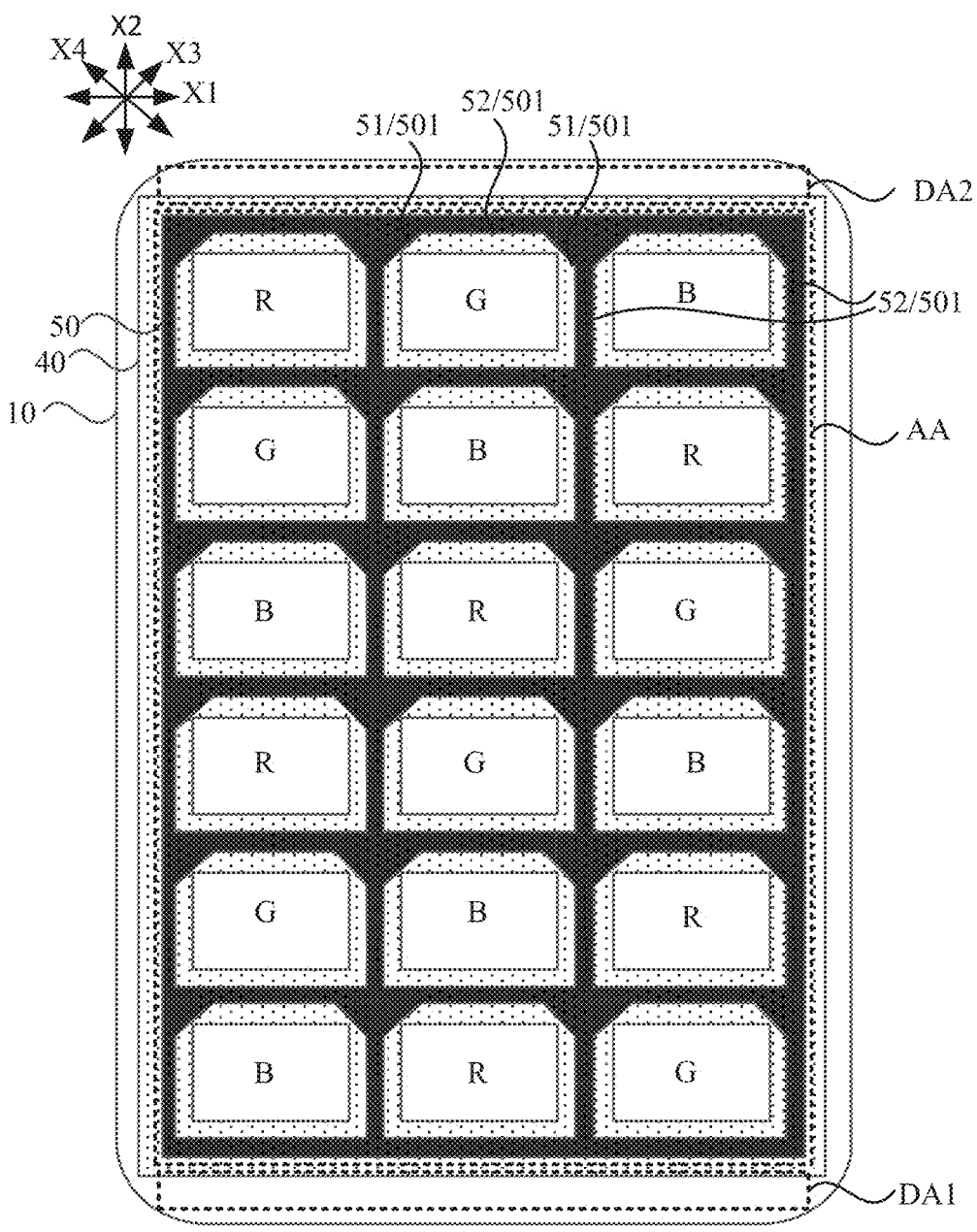
FIG. 7 is a structural view of another display panel according to an embodiment of the present disclosure.

FIG. 7 is a structural view of another display panel according to an embodiment of the present disclosure. With reference to FIGS. 6 and 7, in an embodiment, the display panel includes a display area and a non-display area. The non-display area includes a first non-display area DA1, and the first non-display area DA1 includes a trace fan-out area. Each of the at least one first-type edge 51 is an edge facing away from one side of the first non-display area DA1, and each of the at least one second-type edge 52 is an edge facing towards one side of the first non-display area DA1 (as shown in FIG. 7). In one embodiment, an arc segment curved towards a direction close to the respective one of the plurality of first openings 401 in each of the at least one first-type edge 51 is located on one side facing away from the first non-display area DA1, and an arc segment curved towards a direction away from the respective one of the plurality of first openings 401 in each of the at least one first-type edge 51 is located on one side facing towards the first non-display area DA1 (as shown in FIG. 6).

In an embodiment, in some embodiments, the first non-display area DA1 is a binding area or an area for setting an IC.

In one embodiment, the existing display device (for example, cell phones) usually have the Home button set in the first non-display area DA1 or set on one side of the display area facing towards the first non-display area DA1 so that users often view the screen of the display device from the side of the first non-display side but rarely view the screen of the display device from the side of the second non-display area DA2, and therefore, the user are frequently in the scenario of large viewing angle observations from the side of the first non-display area DA1. The first-type edge 51 is set to be the edge on the side facing away from the first non-display area DA1 and the second type edge 52 is set to be the edge facing towards the side of the first non-display area DA1, or the arc segment curved towards the direction away from the first opening 401 in the first type edge 51 is set to be located on one side facing towards the first non-display area DAT so that when the user observes at the large viewing angle from the side of the first non-display area DA1, the display panel brightness is sufficiently large.

Figure 8:
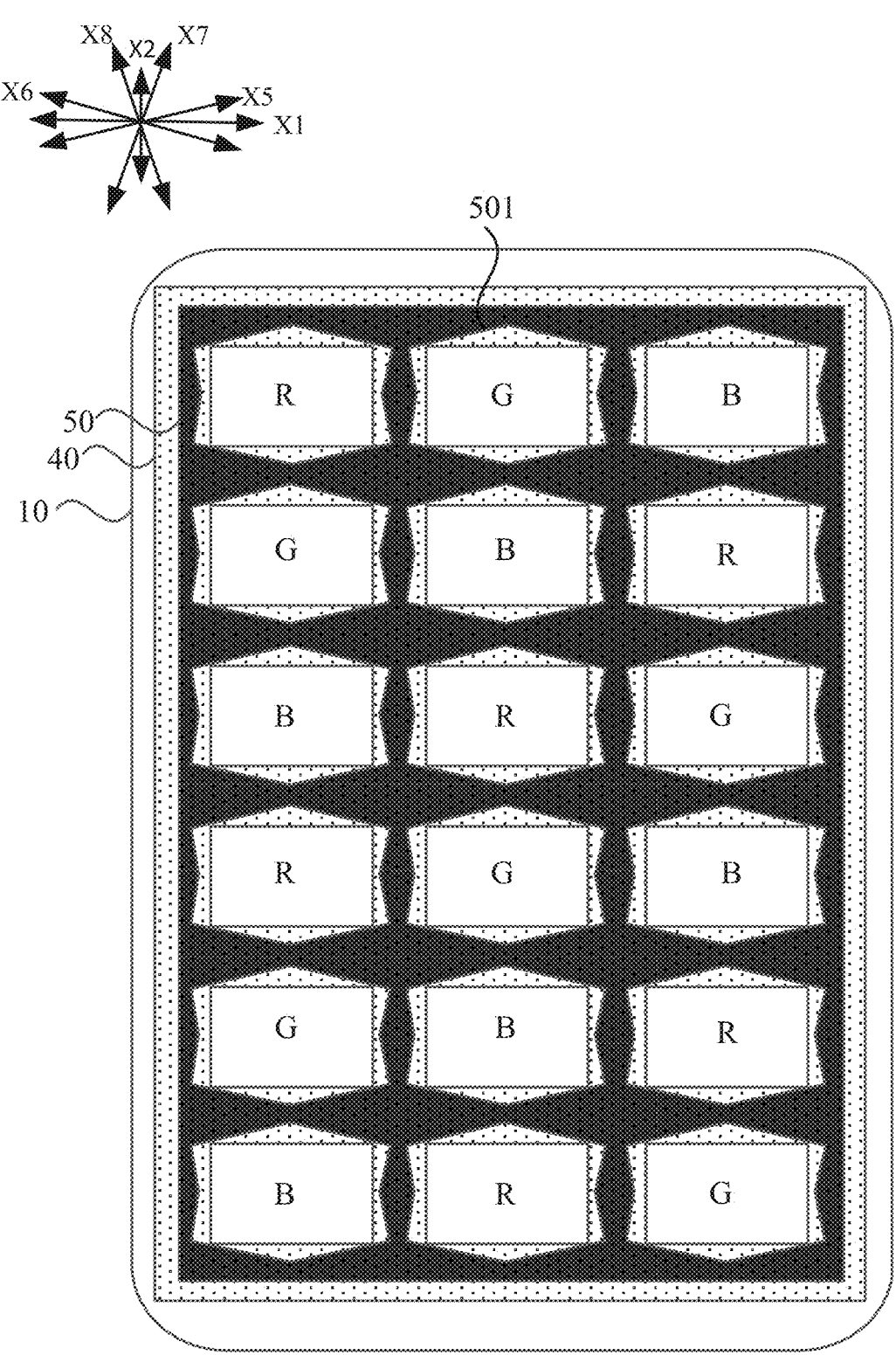
FIG. 8 is a structural view of a display panel according to an embodiment of the present disclosure.
Figure 9:
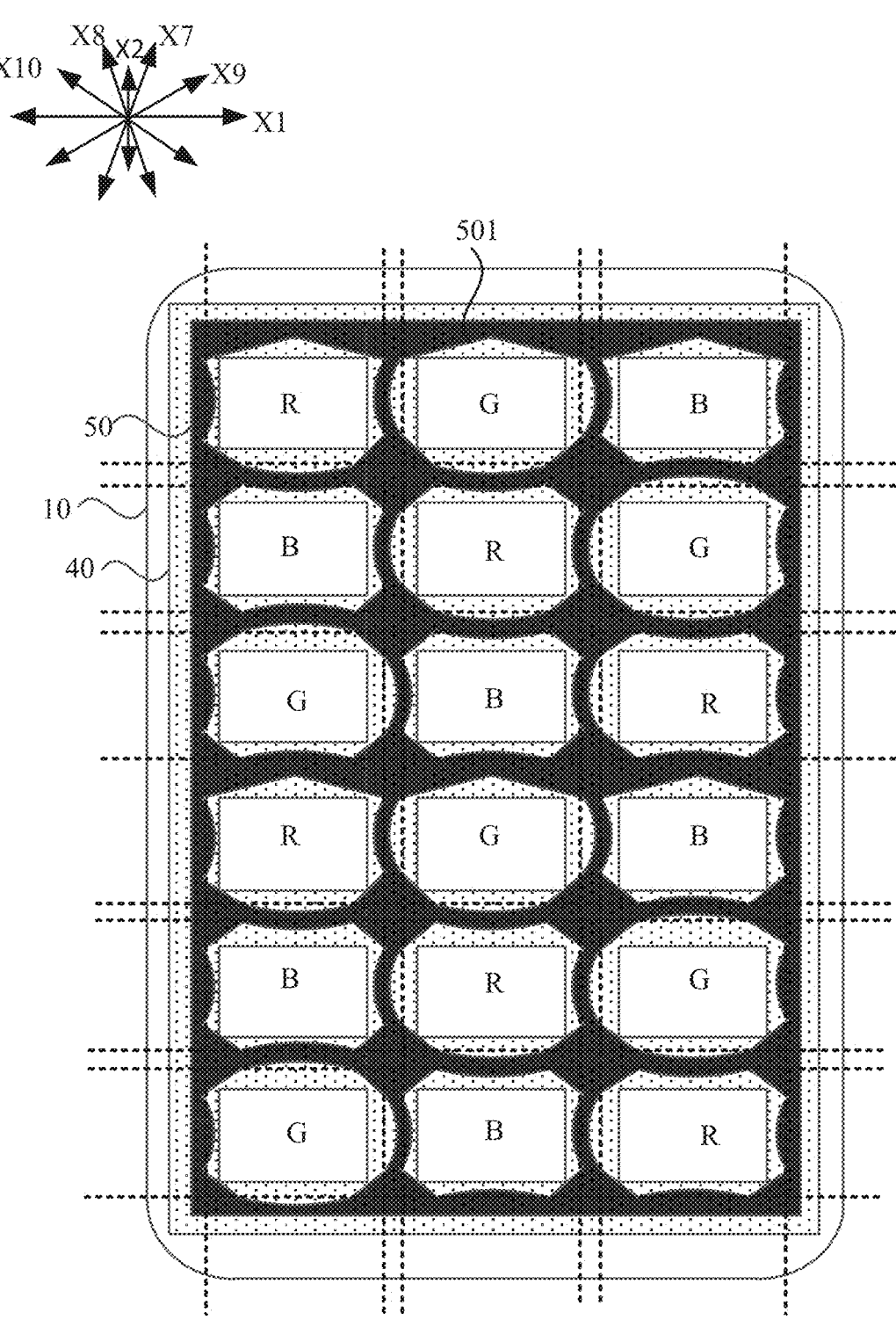
FIG. 9 is a structural view of another display panel according to an embodiment of the present disclosure.
Figure 10:
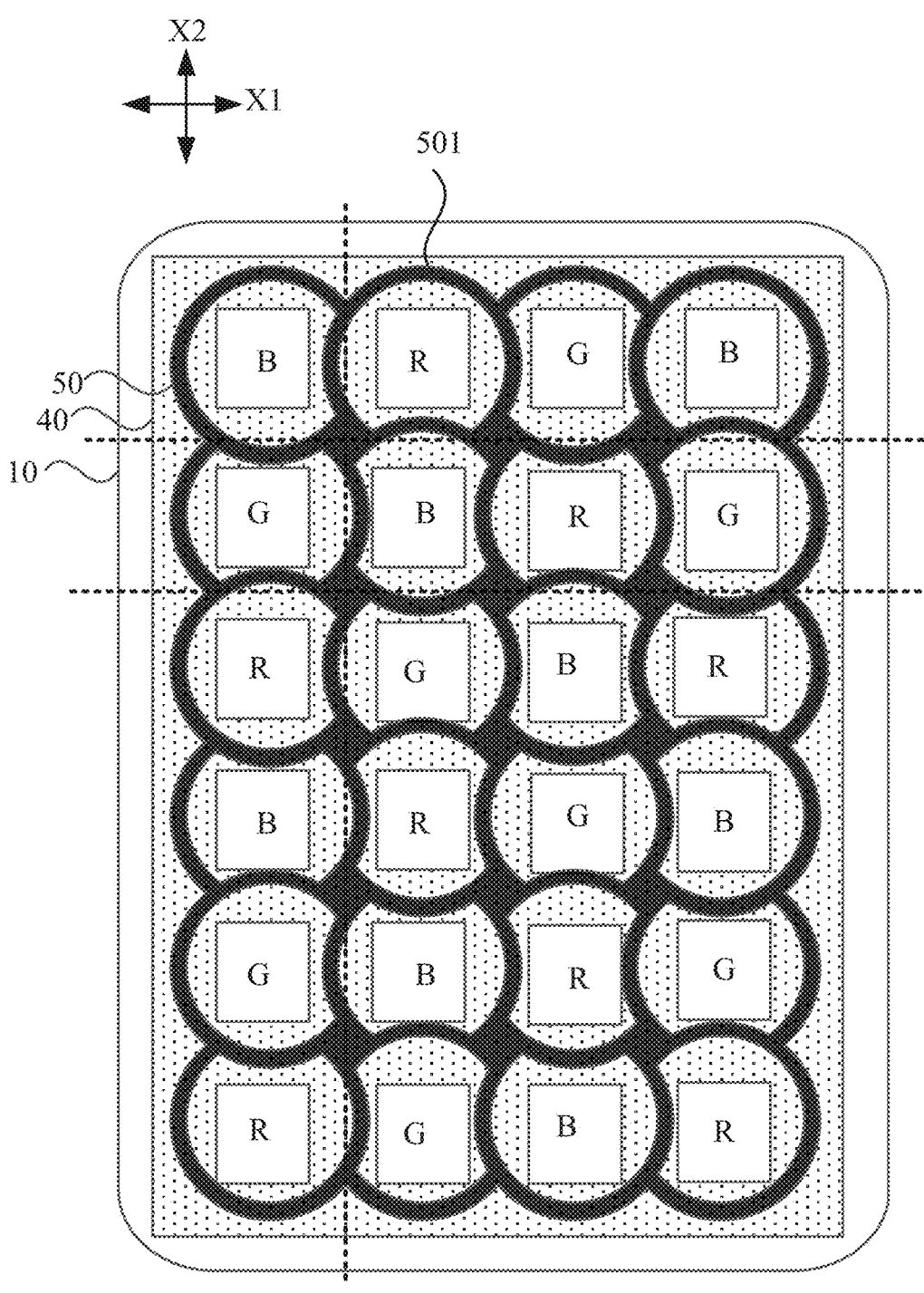
FIG. 10 is a structural view of another display panel according to an embodiment of the present disclosure.

FIG. 8 is a structural view of a display panel according to an embodiment of the present disclosure. FIG. 9 is a structural view of another display panel according to an embodiment of the present disclosure. FIG. 10 is a structural view of another display panel according to an embodiment of the present disclosure. With reference to FIGS. 8 to 10, in an embodiment, the first-type opening 501 is formed by the at least one first-type edge 51.

In one embodiment, the line shape of the first-type edges 51 in the same first-type opening 501 may be the same (as shown in FIGS. 8 and 10) or different (as shown in FIG. 9), which is not limited herein.

It is to be understood that the first-type opening 501 is set to be formed by the at least one first-type edge 51 so that any diffraction direction induced by the first-type opening 501 may be different from the diffraction directions induced by the first opening 401 on the pixel defining layer 40. In this way, the diffraction stripes can be dispersed to more diffraction directions. Therefore, the more diffraction directions included in the diffraction stripes finally presented, the smaller the brightness in each diffraction direction is, and the more favorable it is to improve the problem of visibility degradation caused by diffraction stripes.

With continued reference to FIGS. 6, 9, and 10, in an embodiment, an included angle between a straight line segment formed by connecting a head end and a tail end of at least one arc segment and one edge of the first opening 401 is in a preset included angle range. It is to be noted that in FIGS. 6, 9, and 10, dash lines show straight lines where the straight line segments formed by connecting the head end and the tail end of each of some of the arc segments are located, and straight line segments formed by connecting the head ends and the tail ends of other arc segments can be understood based on the above dash lines.

In one embodiment, the preset included angle range can be set according to the actual situation, which is not limited herein. In an embodiment, the preset included angle range is a range of angles greater than or equal to 0° and less than or equal to 5°. For which specific edge in the first opening 401 corresponds to the arc segment that meets the above requirements can be set according to the actual situation, which is not limited herein. In one embodiment, in the first opening 401 and the first-type opening 501 which correspond to each other, each edge of the first opening 401 corresponds to an arc segment, where the included angle between the arc segment and the straight line segment formed by connecting the head end and the tail end of the arc segment is in the preset included angle range.

It is to be understood that the included angle between the straight line segment formed by connecting the head end and the tail end of the arc segment and one edge of the first opening 401 is set to be in the preset included angle range so that the number of edges in the first-type opening 501 which are parallel or approximately parallel to the edge of the first opening 401 can be reduced, and reducing the number of diffraction directions induced by the first-type opening 501 that are the same as or close to some of the diffraction directions induced by the first opening 401 and reducing the overlapping rate between the diffraction directions induced by the first-type opening 501 and the diffraction directions induced by the first opening 401. In this way, the diffraction stripes can be dispersed to more diffraction directions so that the brightness in each diffraction direction becomes smaller and the overall brightness of the diffraction stripes finally presented can be weakened.

With continued reference to FIGS. 6, 9, and 10, in an embodiment, each of the first-type openings 501 includes at least one of: an arc segment curved towards a direction close to a respective one of the plurality of first openings 401, or an arc segment curved towards a direction away from a respective one of the plurality of first openings 401.

It is to be noted that the first opening 401 involved in the above description of an arc segment curved towards a direction close to a respective one of the plurality of first openings 401 or an arc segment curved towards a direction away from a respective one of the plurality of first openings 401 refers to a first opening 401 corresponding to a first-type opening 501 to which the arc segment belongs.

In one embodiment, according to the actual situation which arc segments being the arch segment curved towards the direction close to the first opening 401 and which arc segments being the arch segment curved towards the direction away from the first opening 401 in the first-type opening 501, which is not limited herein and will be described below by using typical examples.

Figure 11:
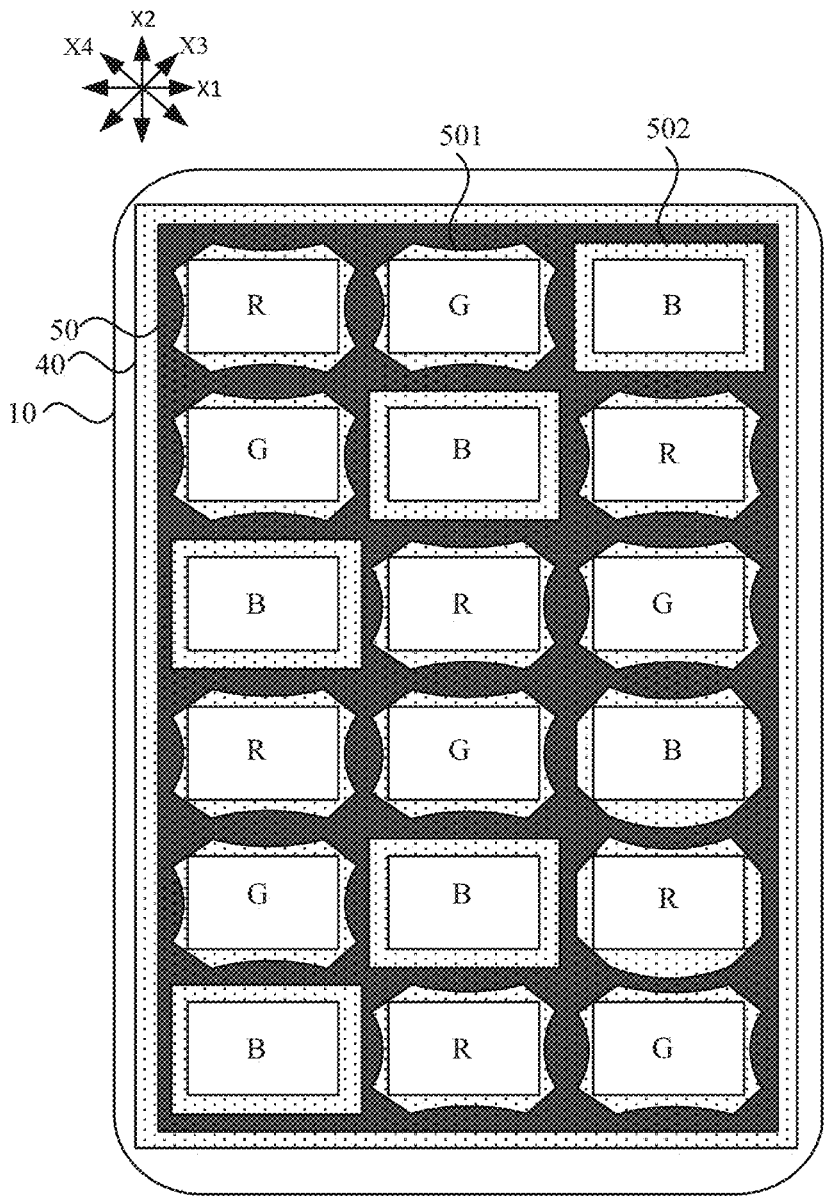
FIG. 11 is a structural view of another display panel according to an embodiment of the present disclosure.
Figure 12:
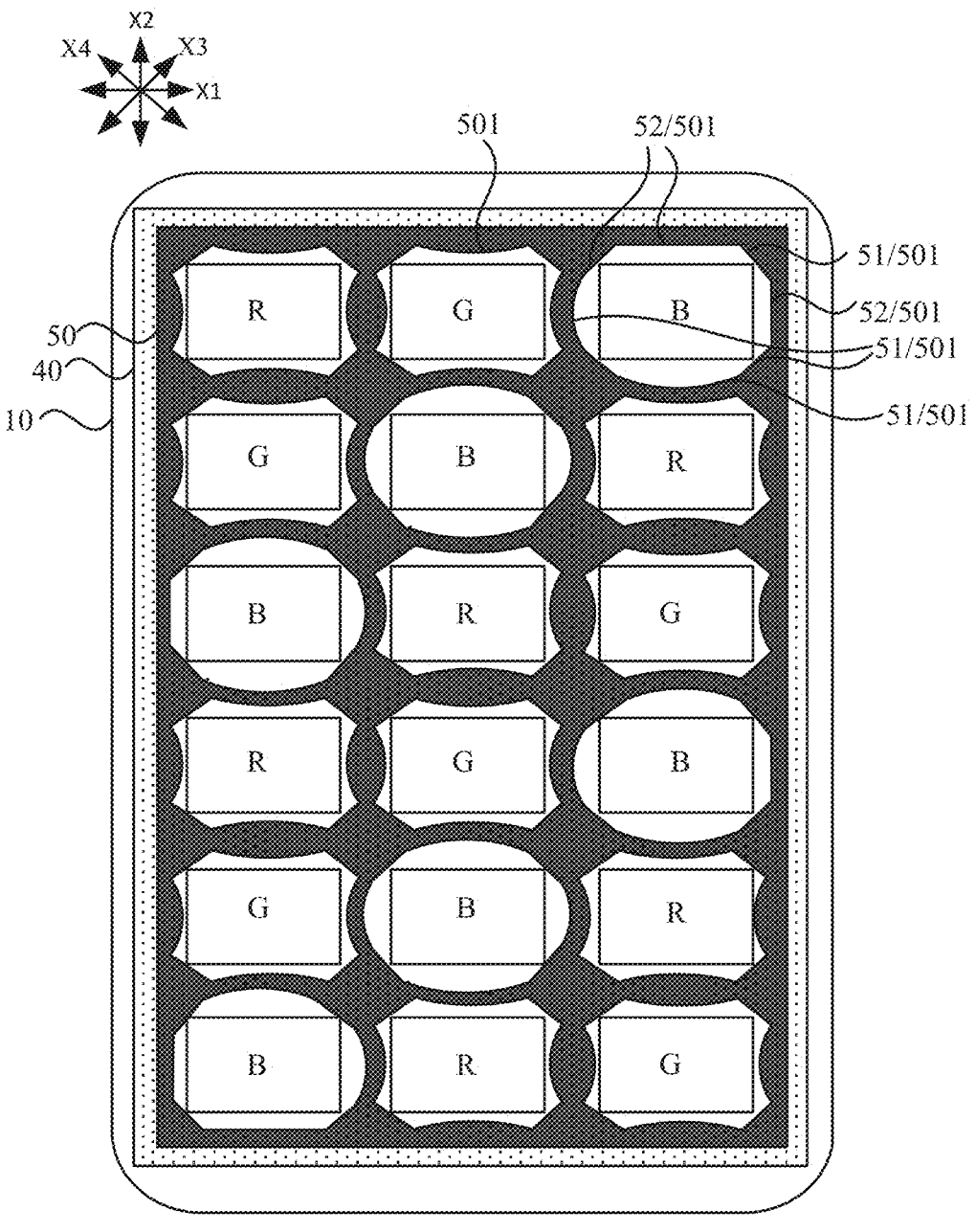
FIG. 12 is a structural view of a display panel according to an embodiment of the present disclosure.

FIG. 11 is a structural view of another display panel according to an embodiment of the present disclosure. FIG. 12 is a structural view of a display panel according to an embodiment of the present disclosure. With reference to FIGS. 11 and 12, in an embodiment, the light-emitting layer

13 includes red light-emitting blocks R, green light-emitting blocks G, and blue light-emitting blocks B, and an arc segment in one of the first-type openings 501 corresponding to one of the green light-emitting blocks G is curved towards a direction close to one of the plurality of first openings 401, where the one of the plurality of first openings 401 corresponds to the one of the first-type openings 501.

It is to be understood that, when the arc segment in one first-type opening 501 is curved towards the direction close to a corresponding first opening 401, the size of this first-type opening 501 is smaller than the size of the second opening setting area, which can weaken the brightness of the sub-pixels corresponding to this first-type opening 501 at the large viewing angle. It is to be further understood that if in a case where the red, green, and blue sub-pixels are of the same design, the display panel is yellow-shifted at the large viewing angle, the arc segment in the first-type opening 501 corresponding to the green light-emitting block G is set to be curved toward the direction close to the first opening 401, which can weaken the brightness of the green sub-pixels at the large viewing angle to some extent so that the color cast at the large viewing angle is closer to the white balance.

In an embodiment, if in a case where the red, green, and blue sub-pixels are of the same design, the display panel is yellow-shifted at the large viewing angle, the second opening corresponding to the red light-emitting block R may be the second-type opening 502 or the first-type opening 501 (as shown in FIGS. 11 and 12). In one embodiment, the arc segment in the first-type opening 501 corresponding to the red light-emitting block R is curved toward the direction close to the first opening 401, and in this way, the brightness of the red sub-pixels at the large viewing angle can be weakened to some extent so that the color cast at the large viewing angle is closer to the white balance.

In an embodiment, if in a case where the red, green, and blue sub-pixels are of the same design, the display panel is yellow-shifted at the large viewing angle, the second opening corresponding to the blue light-emitting block B may be the second-type opening 502 or the first-type opening 501. In one embodiment, the arc segment in the first-type opening 501 corresponding to the blue light-emitting block B is curved toward the direction away from the first opening 401, and in this way, the brightness of the blue sub-pixels at the large viewing angle can be strengthened to some extent so that the color cast at the large viewing angle is closer to the white balance.

It is to be further understood that if in a case where the red, green, and blue sub-pixels are of the same design, the arc segment in the first-type opening 501 of pixels corresponding to the color having higher brightness at the large viewing angle is set to be curved towards the direction close to the first opening 401, and the arc segment in the first-type opening 501 of pixels corresponding to the colors having lower brightness at the large viewing angle is set to be curved towards the direction away from the first opening 401, and details are not described herein. The higher brightness at the large viewing angle and the lower brightness at the large viewing angle described herein are both based on the premise that the red, green, and blue sub-pixels are of the same design.

Figure 13:
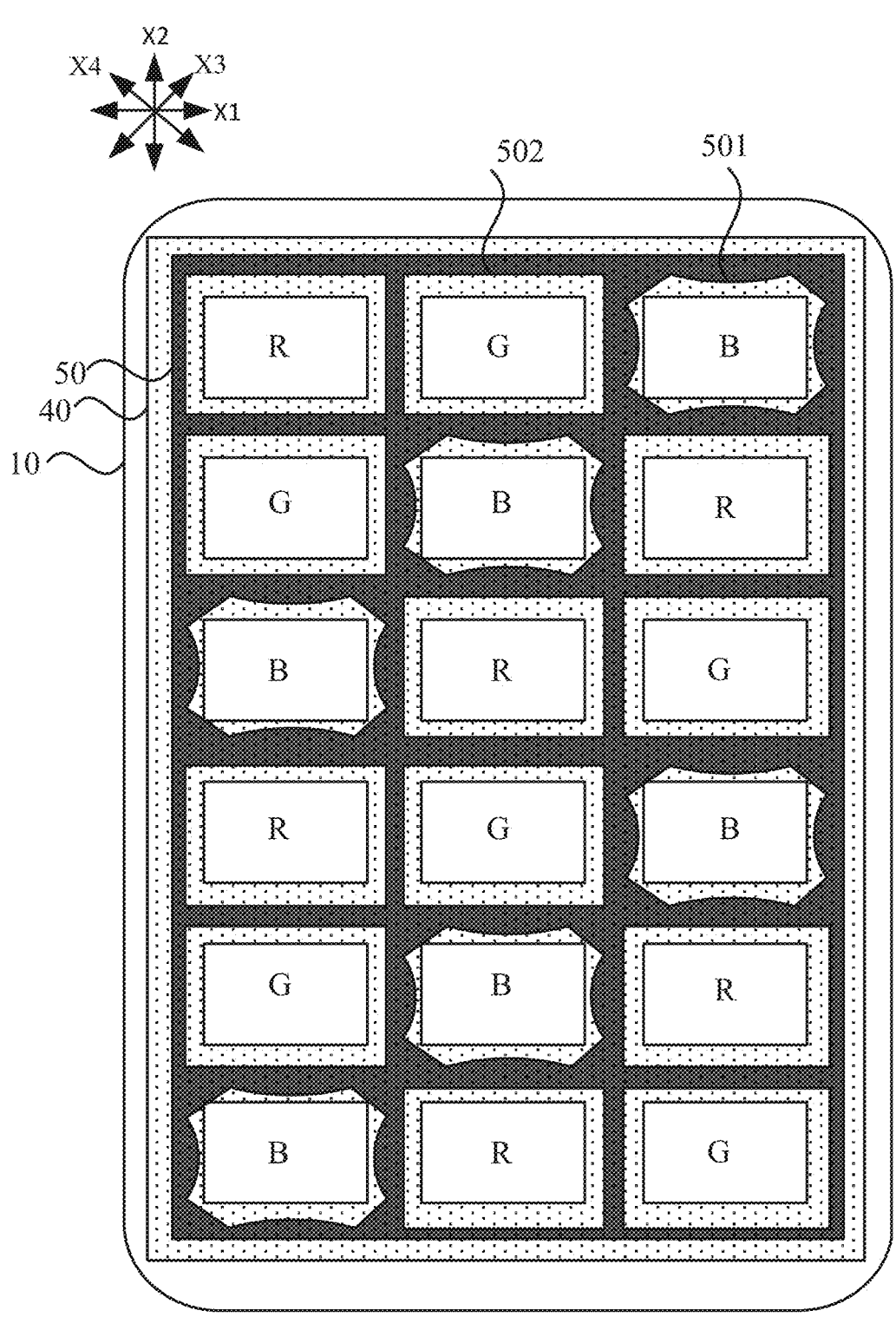
FIG. 13 is a structural view of another display panel according to an embodiment of the present disclosure.

FIG. 13 is a structural view of another display panel according to an embodiment of the present disclosure. With reference to FIG. 13, in an embodiment, the light-emitting layer 13 includes red light-emitting blocks R, green light-emitting blocks G, and blue light-emitting blocks B, and an arc segment in one of the first-type openings 501 corresponding to one of the blue light-emitting blocks B is curved towards a direction close to one of the plurality of first openings 401, where the one of the plurality of first openings 401 corresponds to the one of the first-type openings 501.

It is to be understood that the human eye is not sensitive to blue, and thus the visual effect of the human eye does not change significantly even if the brightness of the blue pixel at the large viewing angle is sacrificed. In this way, the brightness of the diffraction stripes can be reduced, the problem of the visual deterioration caused by the diffraction is improved, and the impact of the setting of the first-type openings 501 on the visual effect of the human eye can be prevented.

With continued reference to FIGS. 6, 9, and 10, in an embodiment, the curving directions of two adjacent arc segments, each of which belongs to a respective one of two adjacent first-type openings 501, are opposite to each other.

In one embodiment, the curving directions opposite to each other described herein refers to that in the two adjacent arc segments belonging to a respective one of the two adjacent first-type openings 501, one arc segment is curved towards the direction close to the first opening 401, and the other arc segment is curved towards the direction away from the first opening 401.

It is to be understood that, when the arc segment in one first-type opening 501 is curved towards the direction close to a corresponding first opening 401, the brightness of the sub-pixels corresponding to this first-type opening 501 at the large viewing angle is weakened; when the arc segment in one first-type opening 501 is curved towards the direction away from a corresponding first opening 401, the size of this first-type opening 501 is larger than the size of the second opening setting area, and thus the brightness of the sub-pixels corresponding to this first-type opening 501 at the large viewing angle is strengthened. When the curving directions of the two adjacent arc segments belonging to a respective one of the two adjacent first-type openings 501 are set to be opposite to each other, for two sub-pixels corresponding to a respective one of the two first-type openings 501, the brightness of one sub-pixel at the large viewing angle is weakened while the brightness of the other sub-pixel at the large viewing angle is strengthened, and ensuring that the brightness at the large viewing angle is sufficiently large.

It is to be further understood that as shown in FIGS. 6, 9 and 10 and FIG. 14 to be described later, the shapes or sizes of the sub-pixels are the same or basically the same, which is equivalent to that those sub-pixels are obtained by rotating or translating the same shape. In this way, the structure of the sub-pixels is more uniform, the light-emitting effect is better, and the fabrication of the color filter layer is facilitated.

With continued reference to FIGS. 6, 9, and 10, in an embodiment, two adjacent arc segments, each of which belongs to a respective one of two adjacent first-type openings 501, are parallel to each other. It is to be noted that the description of two adjacent arc segments being parallel described herein refers to that two adjacent arc segments are parallel to each other to the extent that the fabrications process of the black matrix 50 can achieve.

It is to be understood that when two adjacent arc segments, each of which belongs to a respective one of two adjacent first-type openings 501, are set to be parallel to each other, the width of the black matrix can be made uniform, which facilitates both the patterning reliability and the improvement of the uniformity of rendering between sub-pixels of different colors. Since a picture of different colors is formed after sub-pixels of different colors are rendered with each other, for example, for one pixel unit including three sub-pixels RGB, this pixel unit can present various colors after RGB is rendered with each other, in the embodiments of the present disclosure, the width of the black matrixes spaced between different sub-pixels can be made basically the same, which facilitates the improvement of the uniformity of rendering between sub-pixels of different colors.

It is to be further understood that when two adjacent arc segments, each of which belongs to a respective one of two adjacent first-type openings 501, are set to be parallel to each other, the line width of the black matrix corresponding to the two arc segments (that is the distances between the two arc segments) can be equal to each other. In this way, on the one hand, the fabrication process difficulty of the black matrix can be reduced, and on the other hand, the size of each of the first-type openings 501 can be as large as possible by setting the line width of the black matrix corresponding to these two arc segments as the limit process line width, and strengthening the brightness of the display panel.

With continued reference to FIG. 10, in an embodiment, each of the plurality of second openings is a first-type opening 501, and the first-type opening 501 is formed by arc segments curved towards a direction close to one of the plurality of first openings 401 and arc segments curved towards a direction away from the one of the plurality of first openings 401; and the part number of the first-type openings 501 are in a shape of a saddle, and another part number of the first-type openings 501 are in a shape of a circle with a notch.

In one embodiment, each of the first-type openings 501 in the shape of the saddle includes four arc segments, two of which are opposite to each other, where two opposite arc segments are curved towards each other, and another two opposite arc segments are curved away from each other; and each of the first-type openings 501 in the shape of the circle with the notch includes two arc segments, where one of the two arc segments is a major arc and the other of the two arc segments is a minor arc.

It is to be understood that when each of the first-type openings 501 is formed by arc segments, the first-type openings 501 can induce diffraction of light at 360° and can induce reflected light in numerous directions. In this way, the brightness in each diffraction direction can be smaller, and the overall brightness of the diffraction stripes finally presented can be smaller.

Figure 14:
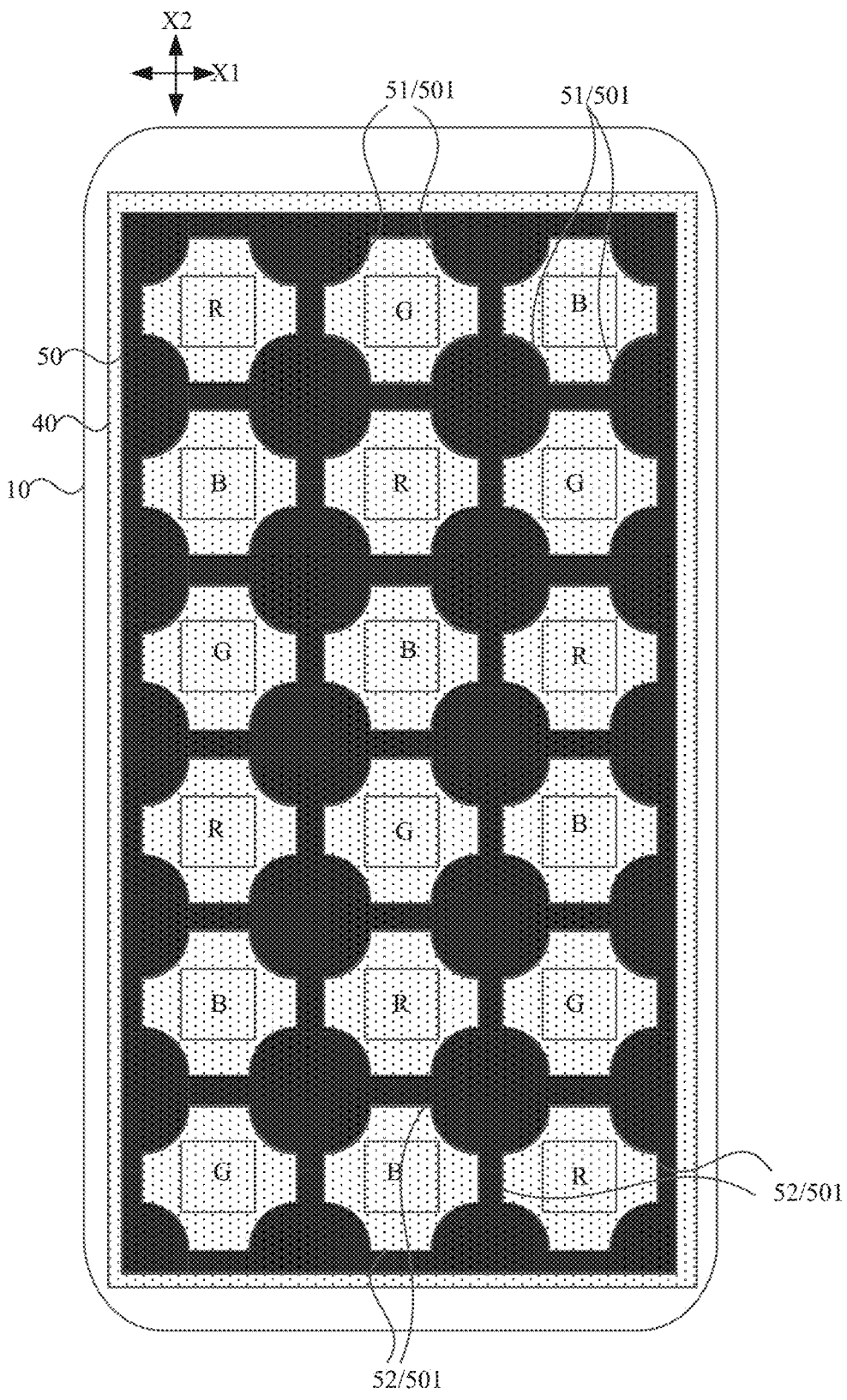
FIG. 14 is a structural view of another display panel according to an embodiment of the present disclosure.

FIG. 14 is a structural view of another display panel according to an embodiment of the present disclosure. With reference to FIG. 14, in an embodiment, each of the plurality of second openings is a first-type opening 501, where each of the first-type openings includes four straight line segments, two of which are opposite to each other, and four arc segments, and each of the four arc segments is connected to two adjacent straight line segments.

In one embodiment, the straight line segments in the first-type openings 501 may be parallel to the straight line segments in the first openings 401 (as shown in FIG. 14) or not parallel, which is not limited herein. In the same first-type opening 501, all arc segments may be curved towards a direction close to the first opening 401 (as shown in FIG. 14), or all arc segments may be curved towards a direction away from the first opening 401, or some arc segments are curved towards the direction close to the first opening 401 while the other arc segments are curved towards in the direction away from the first opening 401, which is not limited herein. In one embodiment, the length of each arc segment in the same first-type opening 501 may be the same (as shown in FIG. 14) or different, which is not limited herein. In one embodiment, each of the first-type openings 501 is in the same shape and is a centrosymmetric figure whose symmetry center coincides with the orthographic projection of the center of a corresponding first opening 401 on the plane where the black matrix 50 is located. In this way, the structure of the black matrix 50 has regularity and periodicity, which facilitates the reduction of the fabrication difficulty of the black matrix 50.

It is to be noted that, in order to clearly mark the first-type opening, the second-type opening, the first-type edge, and the second-type edge, the black matrix in the display panel shown in FIG. 2 is illustrated using separate reference numerals, and the black matrix in FIGS. 5 to 14 is not illustrated using separate reference numerals. The first-type opening, the second-type opening, the first-type edge, and the second-type edge in FIGS. 5 to 14 may be clearly understood that with the reference numerals in FIGS. 2, 4, and 5 to 14. It is to be further noted that in FIGS. 2, 4, and 5 to 14, the extension direction of each edge in the first openings and second openings are marked, where Xn denotes the Nth direction, where n=1, 2, 3, 4, 5, 6, 7, 8, 9, or 10.

It is to be further noted that, in order to distinguish the display panel in the related art from the display panel in the embodiments of the present disclosure, the same structure in the display panel in the related art and the display panel in the embodiments of the present disclosure is marked with different reference numerals.

Figure 15:
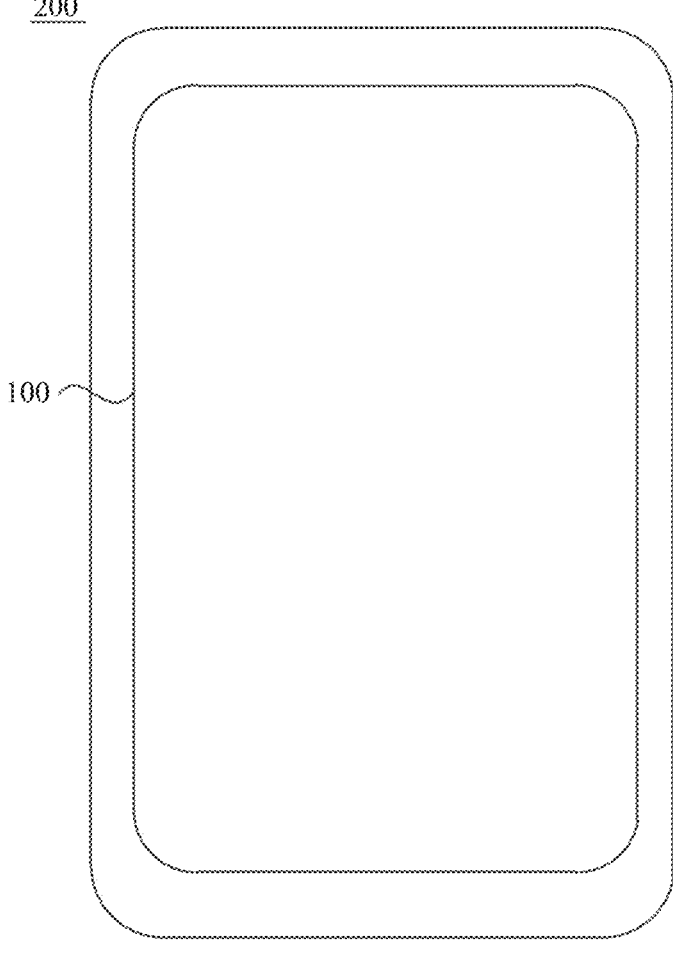
FIG. 15 is a structural view of a display panel in the related art.

Based on the above concept, the embodiments of the present disclosure further provide a display device. The display device includes the display panel described in any embodiment of the present disclosure. Therefore, the display device has the same beneficial effects as the display panel, and for the beneficial effects of the display device, the reference may be made to the above description, which is not repeated herein. In an embodiment, FIG. 15 is a structural diagram of a display device according to an embodiment of the present disclosure. As shown in FIG. 15, the display device provided by the embodiments of the present disclosure includes the display panel provided by the embodiments of the present disclosure. The display device, for example, may be a touch display screen, a mobile phone, a tablet, a laptop, a television, or any electronic device having a display function.

What is claimed is:

1. A display panel, comprising:

a base substrate and an anode layer disposed on the base substrate;

a pixel defining layer located on a side of the anode layer facing away from the base substrate, wherein the pixel defining layer comprises a plurality of first openings;

a light-emitting layer corresponding to the plurality of first openings; and a black matrix located on a side of the light-emitting layer facing away from the base substrate, wherein the black matrix comprises a plurality of second openings;

wherein an orthographic projection of the first opening overlaps an orthographic projection of a second opening of the plurality of second openings; the plurality of second openings comprises a plurality of first-type openings, wherein each first-type opening of the plurality of first-type openings is polygonal and comprises at least one first-type edge and each first-type opening corresponds to a pixel having a single opening structure, wherein the at least one first-type edge and the plurality of first openings comprise the following relationship: each first-type edge of the at least one first-type edge is not parallel to a direction in which the plurality of first openings are arranged, wherein the plurality of second openings further comprises a plurality of second-type openings, and a shape of a second-type opening of the plurality of second-type openings is same as a shape of the first opening corresponding to the second-type opening; and the light-emitting layer comprises red light-emitting blocks, green light-emitting blocks, and blue light-emitting blocks, and second openings of the plurality of second openings corresponding to at least part of the blue light-emitting blocks are the second-type openings, and second openings of the plurality of second openings corresponding to at least part of the green light-emitting blocks or second openings of the plurality of second openings corresponding to at least part of the red light-emitting blocks are the first-type openings.

2. The display panel of claim 1, wherein the light-emitting layer comprises red light-emitting blocks, green light-emitting blocks, and blue light-emitting blocks, and at least one second opening of the plurality of second openings corresponding to the green light-emitting blocks is the first-type opening.

3. The display panel of claim 1, wherein the first-type opening is formed by the first-type edge.

4. The display panel of claim 1, wherein the first-type opening further comprises at least one second-type edge, and one of the at least one second-type edge in the first-type opening is parallel to an edge of the first opening, wherein the first-type opening corresponds to the first opening, and the one of the at least one second-type edge neighbors the edge of the first opening.

5. The display panel of claim 1, wherein the at least one first-type edge is a linear segment.

6. A display panel, comprising:

a base substrate and an anode layer disposed on the base substrate;

a pixel defining layer located on a side of the anode layer facing away from the base substrate, wherein the pixel defining layer comprises a plurality of first openings;

a light-emitting layer corresponding to the plurality of first openings; and a black matrix located on a side of the light-emitting layer facing away from the base substrate, wherein the black matrix comprises a plurality of second openings;

wherein an orthographic projection of the first opening overlaps an orthographic projection of a second opening of the plurality of second openings; the plurality of second openings comprises a plurality of first-type openings, wherein each first-type opening of the plurality of first-type openings is polygonal and comprises at least one first-type edge and each first-type opening corresponds to a pixel having a single opening structure, wherein the at least one first-type edge and the plurality of first openings comprise at least one of the following relationship: each first-type edge of the at least one first-type edge is not parallel to a direction in which the plurality of first openings are arranged, wherein extension directions of the at least one first-type edge in a same first opening are different from each other.

7. A display device, comprising:

a display panel, wherein display panel comprises:

a base substrate and an anode layer disposed on the base substrate;

a pixel defining layer located on a side of the anode layer facing away from the base substrate, wherein the pixel defining layer comprises a plurality of first openings;

a light-emitting layer corresponding to the plurality of first openings; and a black matrix located on a side of the light-emitting layer facing away from the base substrate, wherein the black matrix comprises a plurality of second openings;

wherein an orthographic projection of the first opening overlaps an orthographic projection of a second opening of the plurality of second openings;

the plurality of second openings comprises a plurality of first-type openings, wherein each first-type opening of the plurality of first-type openings is polygonal and comprises at least one first-type edge and each first-type opening corresponds to a pixel having a single opening structure, wherein the at least one first-type edge and the plurality of first openings comprise at least one of the following relationship:

each first-type edge of the at least one first-type edge is not parallel to a direction in which the plurality of first openings are arranged, wherein the plurality of second openings further comprises a plurality of second-type openings, and a shape of a second-type opening of the plurality of second-type openings is same as a shape of the first opening corresponding to the second-type opening; and the light-emitting layer comprises red light-emitting blocks, green light-emitting blocks, and blue light-emitting blocks, and second openings of the plurality of second openings corresponding to at least part of the blue light-emitting blocks are the second-type openings, and second openings of the plurality of second openings corresponding to at least part of the green light-emitting blocks or second openings of the plurality of second openings corresponding to at least part of the red light-emitting blocks are the first-type openings.

* * * * *